United States Patent [19]

Nelson

[11] Patent Number: 4,930,216

[45] Date of Patent: Jun. 5, 1990

[54] PROCESS FOR PREPARING INTEGRATED CIRCUIT DIES FOR MOUNTING

[75] Inventor: Bradley H. Nelson, Austin, Tex.

[73] Assignee: Microelectronics and Computer Technology Corporation, Austin, Tex.

[21] Appl. No.: 321,500

[22] Filed: Mar. 10, 1989

[51] Int. Cl.[5] .............................................. H05K 13/04
[52] U.S. Cl. ........................................ 29/854; 29/885; 29/412; 29/413; 29/414; 437/226
[58] Field of Search ................. 29/854, 885, 412, 413, 29/414, 415; 437/226, 227

[56] References Cited

U.S. PATENT DOCUMENTS 3,280,019  10/1966  Harding et al. ...................... 437/227
4,486,738  12/1984  Sadlo et al. ............................ 29/620
4,542,397   9/1985  Biegelsen et al. ................... 437/226
4,640,721   2/1987  Uehara et al. ........................ 437/203

Primary Examiner—P. W. Echols
Attorney, Agent, or Firm—Fulbright & Jaworski

[57] ABSTRACT

Integrated circuit dies, while still in wafer form, are prepared for surface mounting direct to a substrate without requiring packaging. Holes are made through a wafer having a plurality of integrated circuit dies and are placed between the dies and adjacent the die pads. A layer of insulating material is placed on the wafer and in the outer periphery of the holes. An electrically conductive connection is made between the top of each pad and the inside of the insulating material in an adjacent hole. The dies are separated from each other and may be surface mounted to a substrate by soldering.

8 Claims, 3 Drawing Sheets

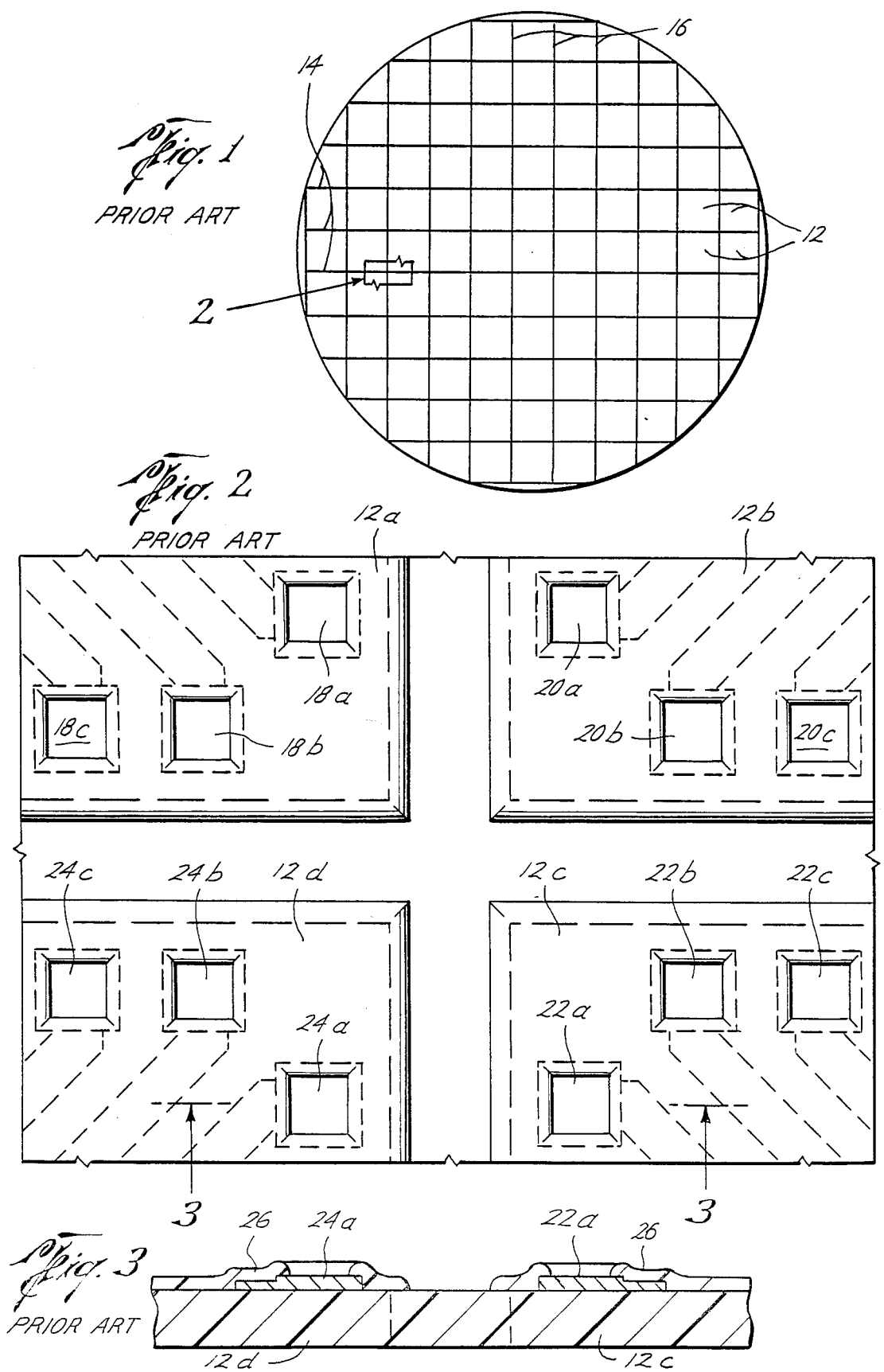

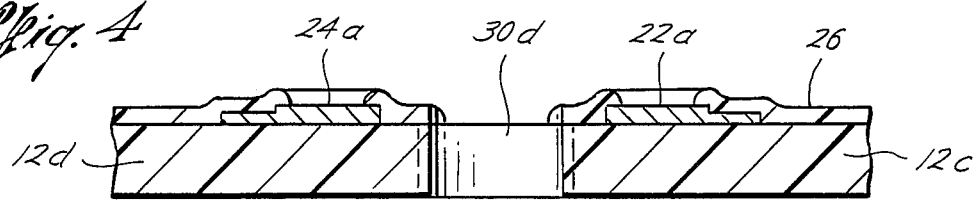
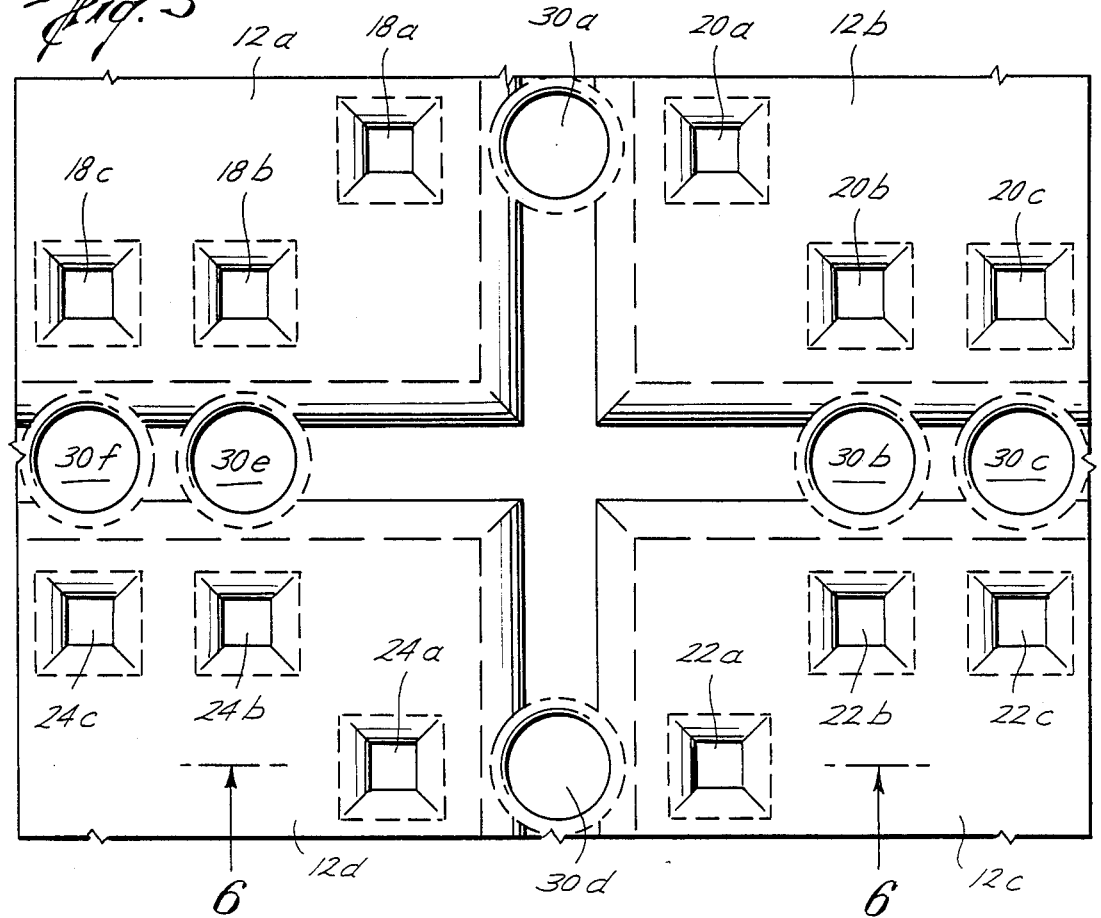
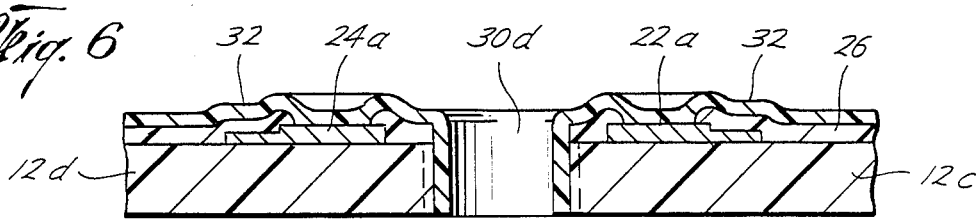
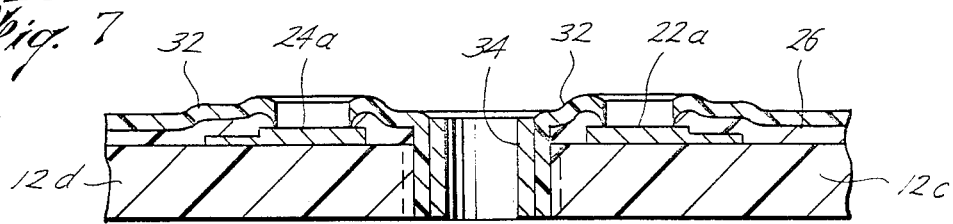

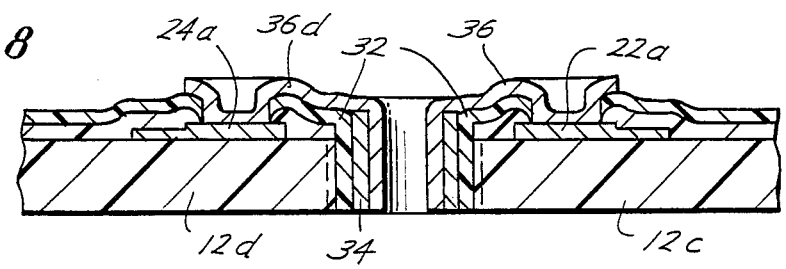
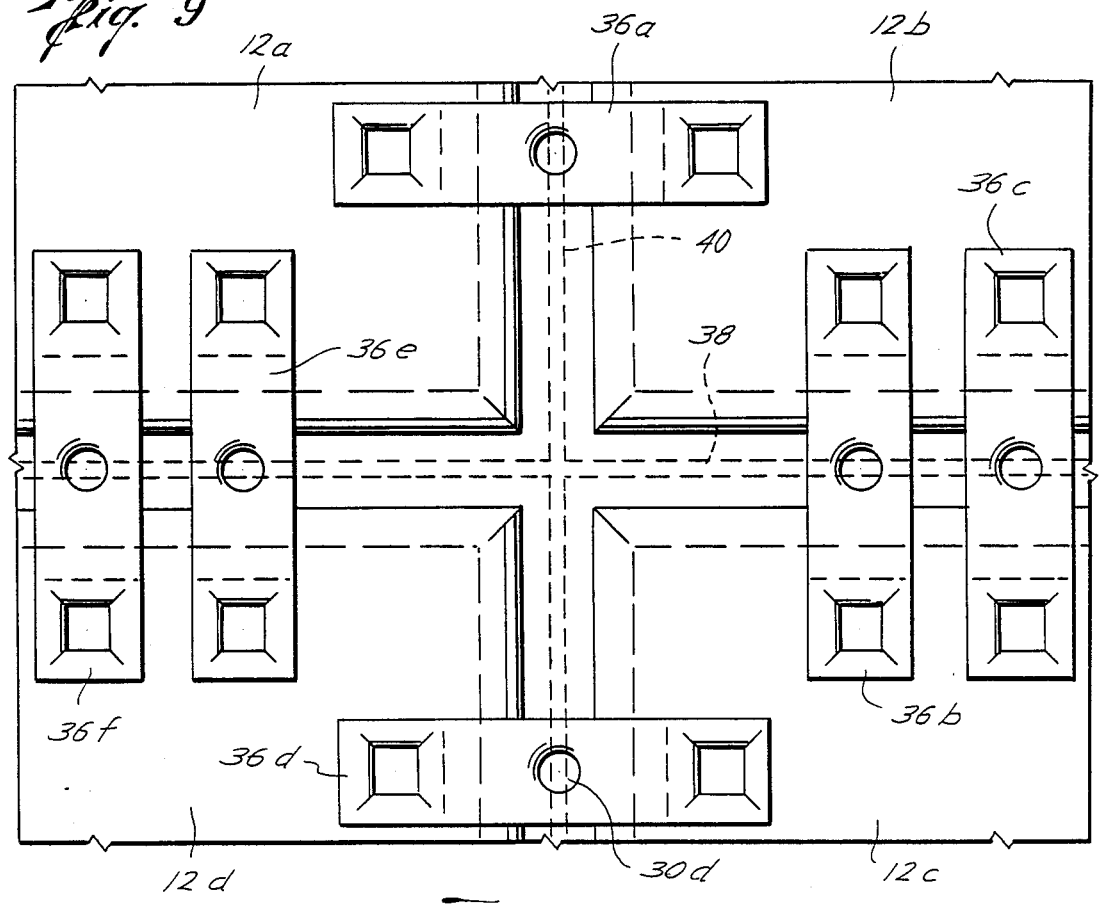
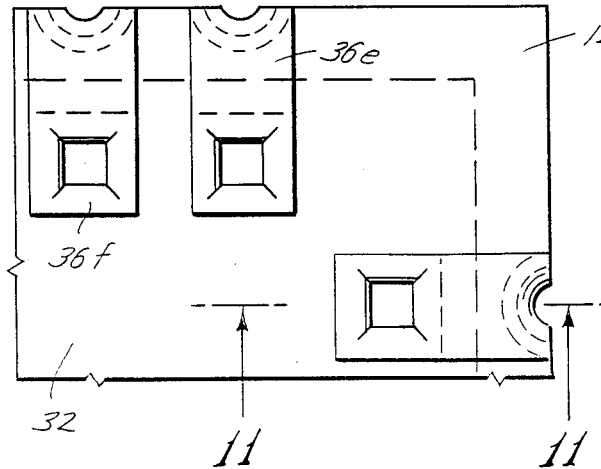
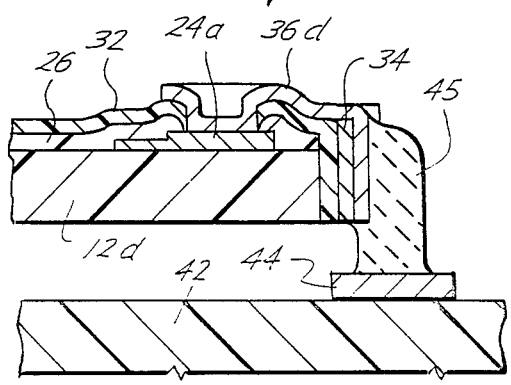

PROCESS FOR PREPARING INTEGRATED CIRCUIT DIES FOR MOUNTING

BACKGROUND OF THE INVENTION

It is known to place an integrated circuit die in a package having serrated edges on the edges of the package and then solder the package to a substrate.

However, the manufacturing of packaging with integrated circuits increases the complexity and expense. The present invention is directed to a process for Preparing integrated circuit dies, while still in wafer form, for surface mounting direct to a substrate without requiring packaging of the dies, while still fabricating the dies in a manner to be corrosion resistant.

SUMMARY

The present invention is directed to a process for preparing integrated circuit dies for mounting on a substrate and includes making holes through a wafer having a plurality of integrated circuit dies in which the dies include bonding pads thereon connected to the integrated circuits in the dies. The holes are placed between the dies and adjacent the pads. The method includes placing a layer of insulating material over the wafer and in the outer periphery of the holes. An electrically conductive connection is patterned from the top of each bonding pad in the inside of the insulating material in an adjacent hole and to the die backside if desired. Thereafter, the plurality of dies are separated from each other along lines extending through the holes between the dies. This leaves the edge and bottom side of the die metallized.

Another feature of the present invention is connecting a die to a substrate by an electrical interconnection to the electrically conductive connection on the inside of the cut holes.

Still another object of the present invention is wherein the holes are placed between pads on adjacent dies whereby each hole may be connected to two pads.

Yet a still further object of the present invention is wherein scribe lines are positioned on the wafer between adjacent dies and the holes are placed on the scribe lines.

A further object of the present invention is a process for preparing integrated circuit dies for mounting on a substrate by making holes through a wafer having a plurality of integrated circuit dies in which the dies include pads thereon connected to integrated circuits in the dies. The holes are placed between the dies and adjacent the pads. A layer of insulating material is placed over the wafer and in the outer periphery of the holes. The insulating material is then removed from the tops of the pads. A metal layer is added to the inner periphery of the insulating materials in the holes and a metal connection is added between the top of each pad and the metal layer in the holes and the back side if desired. The plurality of dies are separated, such as by sawing, along the lines passing through the holes between the dies. A die may be connected to a substrate by soldering the metal layer on the inside of the cut holes to the substrate.

Other and further objects, features and advantages will be apparent from the following description of a presently preferred embodiment of the invention, given for the purpose of disclosure, and taken in conjunction with the accompanying drawings.

BRIEF DESCRIPTION OF THE DRAWINGS

FIG. 1 is an elevational view of a conventional wafer having a plurality of integrated circuit dies, FIG. 2 is an enlarged elevational view of the intersection 2 of FIG. 1, FIG. 3 is a cross-sectional view taken along the line 3—3 of FIG. 2, FIG. 4 is a view similar to FIG. 3 with the addition of the steps of providing holes through the wafer between adjacent dies, FIG. 5 is an elevational view of the structure of FIG. 4 with the addition of an insulating layer over the wafer and on the inside periphery of the holes, FIG. 6 is a cross-sectional view taken along the line 6—6 of FIG. 5, FIG. 7 is a view similar to FIG. 6 showing the step of removing the insulation from the top of the bonding pads on the dies and with the addition of a metal layer on the inside circumference of the holes, FIG. 8 is a view similar to FIG. 7 with the addition of a metal connection between the pads and the metal layer on the inside circumference of the holes, FIG. 9 is an elevational view of the structure of FIG. 8 and also indicating cutting lines between adjacent dies along which the dies are separated, FIG. 10 is a fragmentary elevational view illustrating one of the dies of FIG. 9 which has been separated from the wafer, and FIG. 11 is a cross section taken along the line 11—11 of FIG. 10 with the addition of a soldering connection between the die and a substrate.

DESCRIPTION OF THE PREFERRED EMBODIMENT

Referring now to the drawings, the reference numeral 10 generally indicates a conventional wafer, such as a silicon wafer, having a plurality of integrated circuit dies 12 thereon and conventional scribe lines 14 and 16 thereon between adjacent dies 12 along which the wafer 10 is conventionally sawed for separating the dies 12.

Referring now to FIGS. 2 and 3, an enlarged plan view and section view of a portion of the wafer 10 is shown in which the individual dies are numbered 12a, 12b, 12c and 12d for convenience. As is conventional, each of the dies includes a plurality of bonding pads which are connected to the integrated circuits for providing for connection of the dies to other components. For example, die 12a includes a plurality of bonding pads 18a, 18b, and 18c. Die 12b includes a plurality of bonding pads 20a, 20b, and 20c. Die 12c includes a plurality of bonding pads 22a, 22b and 22c, and die. 12d includes a plurality of bonding pads 24a, 24b and 24c. As is conventional, an insulating layer 26 is provided over the dies 12. The bonding pads are generally metallic such as aluminum.

The above description of a wafer 10 and its components is conventional. Normally, the wafer 10 is sawed along the scribe lines 14 and 16 separating the individual integrated circuit dies 12 from each other and they can be encapsulated in a package having serrated edges for soldering the package to a substrate, which is expensive.

The present invention is directed to a process for preparing the integrated circuit dies, while still in wafer form for surface mounting direct to a substrate without requiring an expensive package.

Referring now to FIGS. 4 and 5, a plurality of holes, for example 5 mil diameter holes, are made through the wafer 10 between the dies 12 and adjacent the bonding pads. The holes may be made by any suitable means such as etching, or ultra-sonic drilling. Preferably, the holes are made on the scribe lines 14 and 16, and where possible between adjacent pads on adjacent dies for allowing each hole to be connected to two pads as will be more fully described hereinafter.

For example, hole 30a may be made through the wafer 10 between dies 12a and 12b between pads 18a and 20a. Hole 30b is between dies 12b and 12c between pads 20b and 22b, hole 30c is between dies 12b and 12c between pads 20c and 22c, hole 30d is between dies 12c and 12d between pads 24a and 22a, hole 30e is between dies 12a and 12d between pads 18b and 24b, and hole 30f is between dies 12a and 12d between pads 18c and 24c. A layer of insulating material 32, such as silicon oxide or silicon nitride, is applied over the wafer 10 and in the outer periphery of but not filling the holes, as best seen in FIG. 6, such as by the process of chemical vapor deposition.

As best seen in FIG. 7, the insulating material 32 is removed from the top of the bonding pads such as by patterning with photoresist and reactive ion etching. As an alternative, the insulating layer 32 may be placed over the wafer 10 in the step of FIG. 6 leaving the top of the pads bare, but it is preferable to use the step shown in FIG. 6 of coating the entire wafer with the insulating layer 32 and then removing it from the pads, as shown in FIG. 7, for ease of manufacture. After the inside of the holes have been insulated an electrically conductive layer 34, such as copper or gold, is placed around the inner periphery of but not filling the insulating material 32 in the holes, such as by the process of pattern electroplating.

Referring now to FIGS. 8 and 9, an electrically conductive connection 36a, 36b, 36c, 36d, 36e, and 36f is added between the top of each pad such as copper or gold, by the process of pattern electroplating or sputter deposition followed by resist patterning and wet etch, to the layer 34 in an adjacent hole. If desired, the step of FIG. 7 of adding the layer 34 may be omitted and combined with the step of FIG. 8 of adding the electrical interconnection between the interior of the hole and the pad. Thus, electrical conductive connection 36a connects pads 18a and 20a to hole 30a. Similarly, the other electrically conductive connections 36b, 36c, 36d, 36e, and 36a join preferably two pads to the interior of a single hole.

As best seen in FIG. 9, cut lines 38 and 40 are illustrated in dotted outline coaxially along the scribe lines 14 and 16 (not numbered). A normal separation operation, such as conventional sawing, is used for separating the individual dies 12 in the wafer 10. It is to be noted that the separation occurs along lines 38 and 40 which extend through the holes between the dies. The result of separating the dies from each other is shown in FIG. 10 in which each of the dies is covered with an insulating layer 32 and having an electrical conductive connection from each of the pads extending to the edge of the die into the holes which have been cut and are provided with an electrically metal connection on the inside of the cut hole.

As best seen in FIG. 11, the die, such as die 12d, may now be connected to any suitable substrate such as a silicon substrate 42, having a pad 44 which is connected to one of the connections on the die 12d by soldering 45 between the pad 44 and the electrical connection 36d.

The present invention thereby provides an inexpensive integrated circuit which can be easily surface mounted directly to a substrate and which could also be extended for assembling 3-D arrays of devices as well as providing an integrated circuit that is very reliable in terms of corrosion resistance.

The present invention, therefore, is well adapted to carry out the objects and attain the ends and advantages mentioned as well as others inherent therein. While a presently preferred embodiment of the invention has been given for the purpose of disclosure, numerous changes in the details of construction, arrangement of parts, and steps of the process, will be readily apparent to those skilled in the art and which are encompassed within the spirit of the invention and the scope of the appended claims.

What is claimed is:

1. A process for preparing integrated circuit dies for mounting on a substrate comprising,
    making holes through a wafer having a plurality of integrated circuit dies in which the dies include pads thereon connected to integrated circuits in the dies, said holes being placed between the dies and adjacent the pads,
    placing a layer of insulating material over the wafer and in the outer periphery of the holes,
    adding an electrically conductive connection between the top of each pad and the inside of the insulating material in an adjacent hole, and
    separating the plurality of dies from each other along lines extending through the holes between the dies.

2. The process of claim 1 including,
    connecting a die to a substrate by an electrical interconnection to the electrically conductive connection on the inside of the holes.

3. The process of claim 1 wherein the holes are placed between pads on adjacent dies.

4. The process of claim 1 wherein scribe lines are positioned on the wafer between adjacent dies and the holes are placed on the scribe lines.

5. A process for preparing integrated circuit dies for mounting on a substrate comprising,
    making holes through a wafer having a plurality of integrated circuit dies in which the dies include pads thereon connected to integrated circuits in the dies, said holes being placed between the dies and adjacent the pads,
    placing a layer of insulating material over the wafer and in the outer periphery of the holes,
    removing the insulating material from the top of the pads,
    adding a metal connection between the top of each pad and the inside of the insulating material in said adjacent hole, and
    separating the plurality of dies from each other along lines passing through holes between the dies.

6. The process of claim 5 including,
    connecting a die to a substrate by soldering the metal connections on the inside of the holes to the substrate.

7. The process of claim 5 wherein the holes are placed between pads on adjacent dies.

8. The process of claim 5 including placing a metal layer to the inner periphery of the insulating material in the holes prior to adding the metal connection.

* * * * *